(12) United States Patent  
Lee et al.

(10) Patent No.: US 8,289,748 B2  
(45) Date of Patent: Oct. 16, 2012

(54) TUNING A VARIABLE RESISTANCE OF A RESISTIVE SENSE ELEMENT

(75) Inventors: Brian S. Lee, Boston, MA (US); Haiwen Xi, Prior Lake, MN (US); Patrick J. Ryan, St. Paul, MN (US); Rod Bowman, Bloomington, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 340 days.

(21) Appl. No.: 12/497,929

(22) Filed: Jul. 6, 2009

(65) Prior Publication Data

US 2010/0103717 A1  Apr. 29, 2010

Related U.S. Application Data

(60) Provisional application No. 61/108,790, filed on Oct. 27, 2008.

(51) Int. Cl.  
*G11C 11/00* (2006.01)

(52) U.S. Cl. ........................................ 365/148; 365/163

(58) Field of Classification Search .............. 365/148 O, 365/163 X, 148, 163  
See application file for complete search history.

(56) References Cited

U.S. PATENT DOCUMENTS

| | | | | |
|---|---|---|---|---|
| 4,845,533 A | * | 7/1989 | Pryor et al. | 257/4 |
| 5,166,758 A | * | 11/1992 | Ovshinsky et al. | 257/3 |
| 5,930,022 A | * | 7/1999 | Okuma | 359/248 |
| 6,141,241 A | * | 10/2000 | Ovshinsky et al. | 365/163 |
| 6,204,139 B1 | | 3/2001 | Liu et al. | |
| 6,661,720 B2 | * | 12/2003 | Chevallier | 365/201 |
| 7,099,180 B1 | * | 8/2006 | Dodge et al. | 365/148 |
| 7,233,177 B2 | | 6/2007 | Hsu et al. | |
| 7,433,222 B2 | * | 10/2008 | Hosoi et al. | 365/148 |
| 7,571,901 B2 | * | 8/2009 | Philipp | 365/163 |
| 7,746,688 B2 | * | 6/2010 | Kim et al. | 365/163 |
| 7,826,248 B2 | * | 11/2010 | Xi et al. | 365/148 |
| 7,826,255 B2 | * | 11/2010 | Xi et al. | 365/158 |
| 7,868,482 B2 | * | 1/2011 | Greene et al. | 307/82 |
| 2005/0040482 A1 | | 2/2005 | Suzuki et al. | |
| 2005/0151277 A1 | | 7/2005 | Kawazoe et al. | |
| 2008/0144356 A1 | * | 6/2008 | Oh et al. | 365/148 |
| 2008/0174400 A1 | | 7/2008 | Chen et al. | |

OTHER PUBLICATIONS

I. G. Baek, D. C. Kim, M. J. Lee, H.-J. Kim, E. K. Yim, M. S. Lee, J. E. Lee, S. E. Ahn, S. Seo, J. H. Lee, J. C. Park, Y. K. Cha, S. O. Park, H. S. Kim, I. K. Yoo, U-In Chung, J. T. Moon and B. I. Ryu, "Multi-Layer Cross-point Binary Oxide Resistive Memory (OxRRAM) for Post-NAND Storage Applications," Samsung Electronics Co., Ltd., 2005, IEEE.

(Continued)

*Primary Examiner* — VanThu Nguyen  
(74) *Attorney, Agent, or Firm* — Hall Estill Attorneys at Law

(57) ABSTRACT

Method and apparatus for tuning a variable resistance resistive sense element of an electronic device. In some embodiments, a value indicative of a selected number of consecutive pulses is stored in a memory location and a resistive sense element (RSE) is set to a baseline RSE resistance. A tuning operation is performed by applying the selected number of consecutive pulses to the RSE to tune the baseline RSE resistance to a final adjusted resistance.

20 Claims, 6 Drawing Sheets

OTHER PUBLICATIONS

A. Baikalov, Y. Q. Wang, B. Shen, B. Lorenz, S. Tsui, Y. Y. Sun, Y. Y. Xue and C. W. Chu, "Field-driven hysteretic and reversible resistive switch at the Ag-Pr0.7Ca0.3MnO3 interface," Applied Physics Letters, Aug. 4, 2003, pp. 957-959, vol. 83, No. 5, American Institute of Physics.

X. Chen, J. Strozier, N. J. Wu, and A. Ignatiev, "Resistance profile measurements on a symmetric electrical pulse induced resistance," Texas Center for Advanced Materials, 2005, pp. 1-13, University of Houston, Houston, TX.

T. Fujii, M. Kawasaki, A. Sawa, H. Akoh, Y Kawazoe and Y. Tokura, "Hysteretic current-voltage characteristics and resistance switching at an epitaxial oxide Schottky junction SrRuO3/SrTi0.99Nb0.01O3," Applied Physics Letters 86, 2005, pp. 012107-1 thru 012107-3, American Institute of Physics.

M. J. Rozenberg, I. H. Inoue and M. J. Sanchez, "Nonvolatile Memory with Multilevel Switching: A Basic Model," Physical Review Letter, 2004, pp. 1-4, vol. 92, No. 17, The American Physical Society.

* cited by examiner

TUNING A VARIABLE RESISTANCE OF A RESISTIVE SENSE ELEMENT

RELATED APPLICATIONS

This application makes a claim of domestic priority under 35 U.S.C. §119(e) to U.S. Provisional Patent Application No. 61/108,790 filed Oct. 27, 2008.

BACKGROUND

Electronic devices generally operate upon electrical signals. Some devices utilize numerous components to facilitate the various functions of the device. During the manufacture of large quantities of electronic devices, some level of variability in the impedance of the various components may be present.

As will be appreciated, the reliability of an electronic device may be hindered when various components of the device have different impedances. Such variations can adversely affect the functionality of the electronic devices so that considerable loss in efficiency and accuracy may be noticeable.

In these and other types of electronic devices, it is often desirable to increase simplicity and accuracy, particularly with regard to reliability of manufacturing devices to predetermined impedances.

SUMMARY

Various embodiments of the present invention are generally directed to a method and apparatus for tuning a variable resistance resistive sense element of an electronic device.

In accordance with various embodiments, a value indicative of a selected number of consecutive pulses is stored in a memory location while a resistive sense element (RSE) is set to a baseline RSE resistance. A tuning operation is performed by applying the selected number of consecutive pulses to the RSE to tune the baseline RSE resistance to a final adjusted resistance.

These and various other features and advantages which characterize the various embodiments of the present invention can be understood in view of the following detailed discussion and the accompanying drawings.

DETAILED DESCRIPTION

Figure 1:
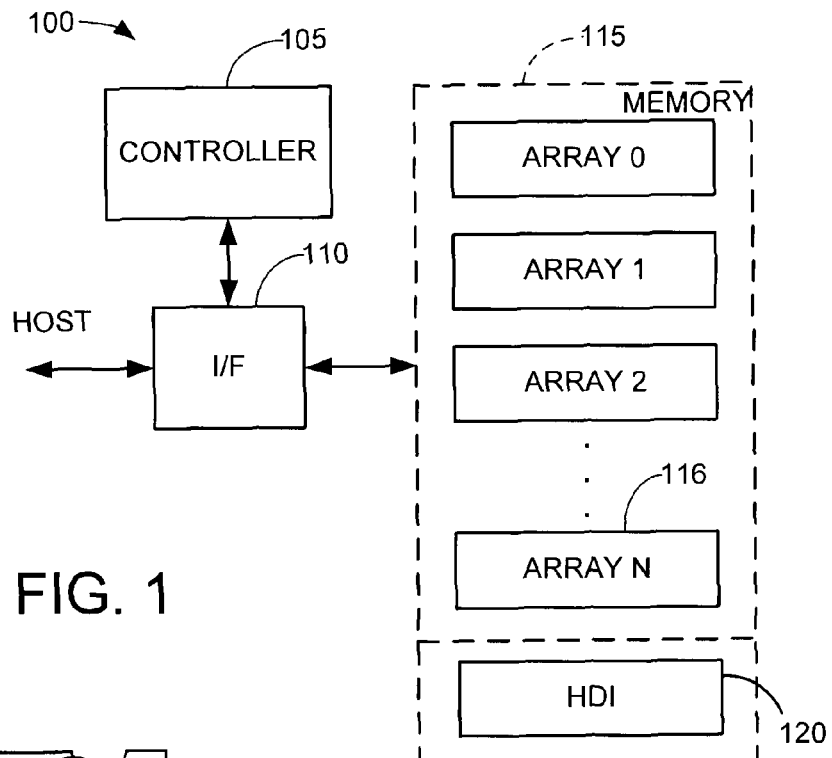
FIG. 1 is a generalized functional representation of an exemplary electronic device constructed and operated in accordance with various embodiments of the present invention.

FIG. 1 provides a functional block representation of an electrical device 100 to provide an exemplary environment in which various embodiments of the present invention can be practiced. The device 100 is characterized as a data storage device such as a solid-state drive (SSD), although such is not limiting.

Top level control of the device 100 is carried out by a suitable controller 105, which may be a programmable or hardware based microcontroller. The controller 105 communicates with a host device via a device interface (I/F) circuit 110. A memory space is shown at 115 to comprise a number of memory arrays 116 (denoted Array 0-N), although it will be appreciated that a single array can be utilized as desired. Each array 116 comprises a block of semiconductor memory of selected storage capacity. A hard disk interface (HDI) 120 can be included to allow a magnetic data storage device to be implemented. The hard disk interface 120 can be accessed by the interface 110 either individually or in combination with other data storage memory arrays 116.

Figure 2:
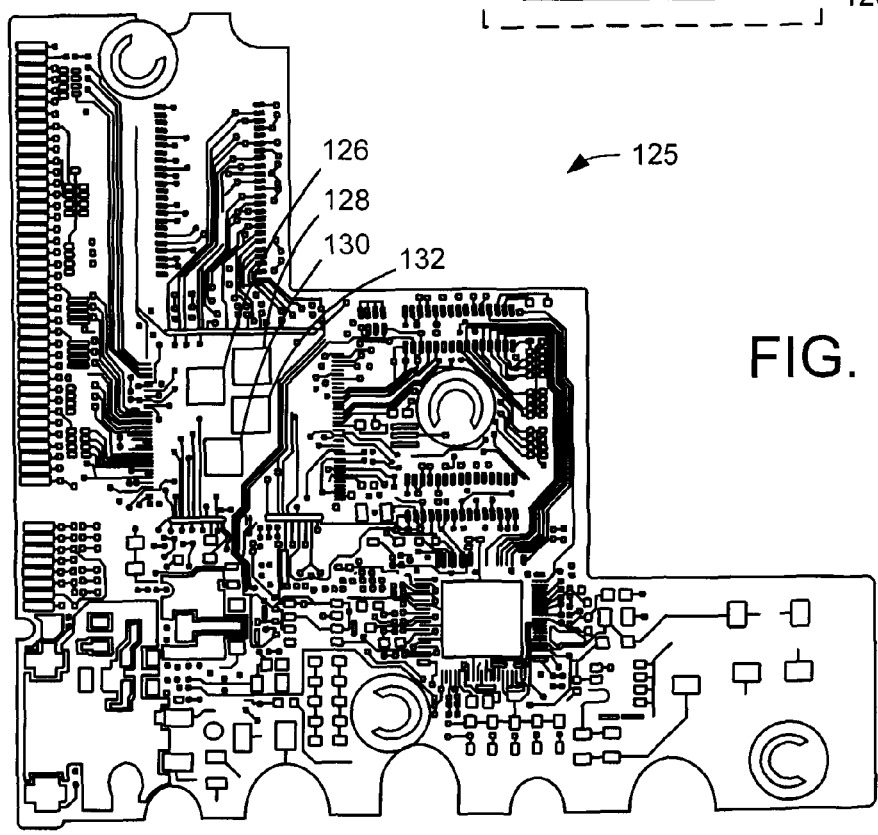
FIG. 2 illustrates an exemplary electronic component capable of being operated in accordance with various embodiments of the present invention.

FIG. 2 provides an exemplary printed circuit board 125 of an electronic device such as 110. Functions of the electronic device are controlled by the hardware installed on, and connected by, the printed circuit board 125.

Hardware represented on the printed circuit board 125 in FIG. 2 include an application specific integrated circuit (ASIC) controller 126, a memory buffer 128, servo motor control logic 130, and read channel signal processor 132. It should be noted that the printed circuit board 125 can employ numerous individual chips with independent functions, individual chips with multiple functions, or a single package having multiple functions either alone or in combination with one another.

The modern advancement of electronic components such as the circuit board of FIG. 2 has increased the complexity of electronic device manufacturing. During the manufacturing of large quantities of electronic devices, the probability of meeting design tolerances and system requirements, such as circuit impedance, can be greatly reduced. Such manufacturing variations can negatively affect the efficiency and accuracy of electronic devices. Hence, the functionality and reliability of the electronic components would be hindered.

Accordingly, as explained below various embodiments of the present invention are generally directed to the integration of a variable resistance resistive sense element (RSE) in an electrical device. The RSE allows for tuning during the manufacturing process to accommodate for inherent variability in component construction. The RSE can take any number of forms, including but not limited to, a resistor with resistance that can be changed by electrical pulse as used for resistive random access memory (RRAM), a phase change material as used in phase change random access memory (PCRAM), and a programmable metallic cell (PMC).

Figure 3:
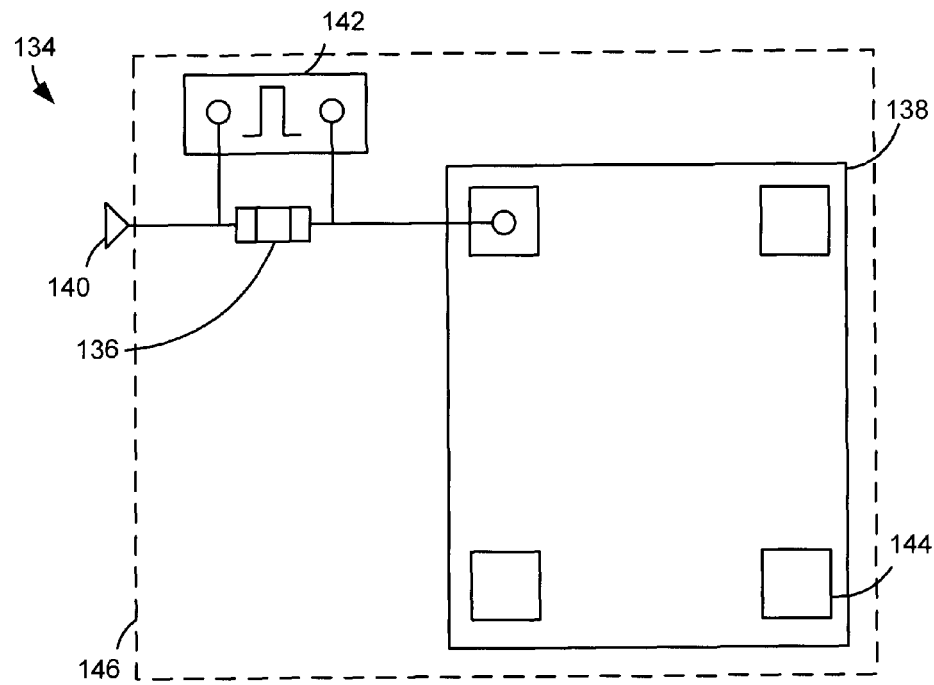
FIG. 3 shows a circuit system operated in accordance with various embodiments of the present invention.

FIG. 3 displays a circuit system 134 constructed and operated in accordance with various embodiments of the present invention. An RSE 136 is connected at an interface between a circuit 138 and an input/output port 140. The RSE 136 is configurable to a variety of resistances by a tuning circuit 142 that is capable of sending signals through the RSE 136 in varying polarities, intensities, and durations. In some embodiments, the circuit 138 is connected to the RSE 136 by a pad 144. Further, the circuit 138 can have a single pad 144 or numerous pads to accommodate the connection of various electrical components to the circuit 138.

It can be appreciated that the circuit 138 can be a number of different electrical components including, but not limited to, an integrated circuit (IC) board or chip package. The pad 144 is also not limited to the embodiment depicted in FIG. 3, but instead can be any electrical connection capable of connecting a circuit to another electrical component. Likewise, the circuit 138, tuning circuit 142, and RSE 136 can be a part of a single device 146 or external to a single component. That is, the circuit 138 can be an electrical device with the RSE 136, port 140, and tuning circuit 142 being connected from an external environment. After resistance tuning, the tuning circuit 142 can be removed from the other component, in various embodiments of the present invention. Otherwise, any combination of the components of FIG. 3 can be housed inside a common device, such as device 146.

Figure 4:
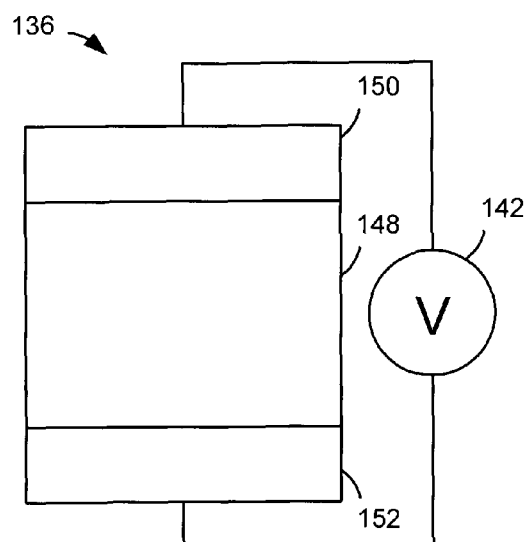
FIG. 4 displays a non-volatile resistive sense element operated in accordance with the various embodiments of the present invention.

FIG. 4 shows an RSE 136 constructed and operated in accordance with various embodiments of the present invention. The ability to tune the impedance of the circuit 138 of FIG. 3 with precision is due to the RSE 136 undergoing an electrical pulse induced resistance (EPIR) effect. The EPIR effect allows a number of consecutive electrical pulses to gradually increase (or decrease) the resistance of the RSE 136. As an electrical pulse travels through the RSE 136, a media layer 148 begins to either form an electrically conductive filament between a top electrode 150 and a bottom electrode 152 or move oxygen vacancies in the media layer, depending on the resistance change mechanism. The media layer 148 can be constructed of a variety of materials including, but not limited to, transition metal oxides, perovskite complex oxides, ferroelectric materials, and high temperature superconductive materials.

The media layer 148 can be organic or polymer materials that express the EPIR effect. The EPIR effect can further be enhanced with the doping of either the top or bottom electrode 150 and 152 individually or in combination. In addition, the layout of the electrodes with respect to the media layer 148 and the size of the RSE 136 can be adjusted for various aesthetic and technical optimizations.

In the media layer 148, a fully developed filament for the filament mechanism will easily allow current to pass through the RSE 136 and correspond to a low resistance state. In contrast, the absence of a filament will result in the RSE 136 having a high resistance state. To program the RSE 136 to a resistance threshold, the tuning circuit 142 (of FIG. 3) is capable of sending electrical pulses to either electrode of the RSE 136 to set a low or high resistance state. Alternatively, the tuning circuit 142 can retrieve and implement a stored number from a selected position in memory that corresponds to a number of pulses to program the RSE 136 to a resistance between the low or high resistance states.

Figure 5:
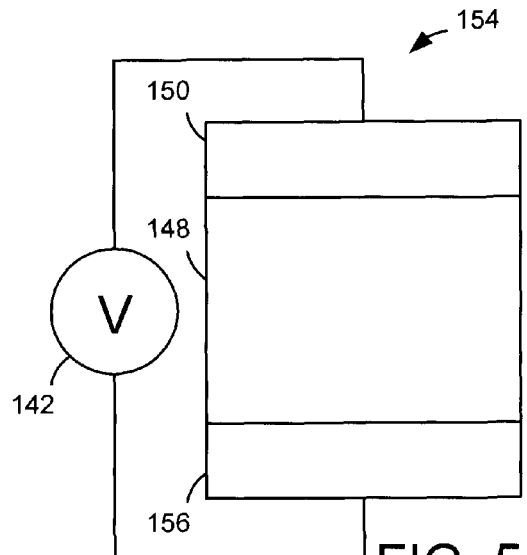
FIG. 5 shows a non-volatile resistive sense element operated in accordance with various embodiments of the present invention.

In FIG. 5, an alternative construction of an RSE 154 is displayed. An asymmetric RSE 136, as shown in FIG. 4, is constructed when the top electrode 150 and the bottom electrode 156 are different materials. However, a symmetric RSE 154 can be constructed by using the same material for the top and bottom electrodes. The operation of the asymmetric RSE 136 may be different from the operation of the symmetric RSE 154. As such, the change of the resistance of the device, increase or decrease of the resistance is dependant on the polarity of the applied voltage.

Figure 6:
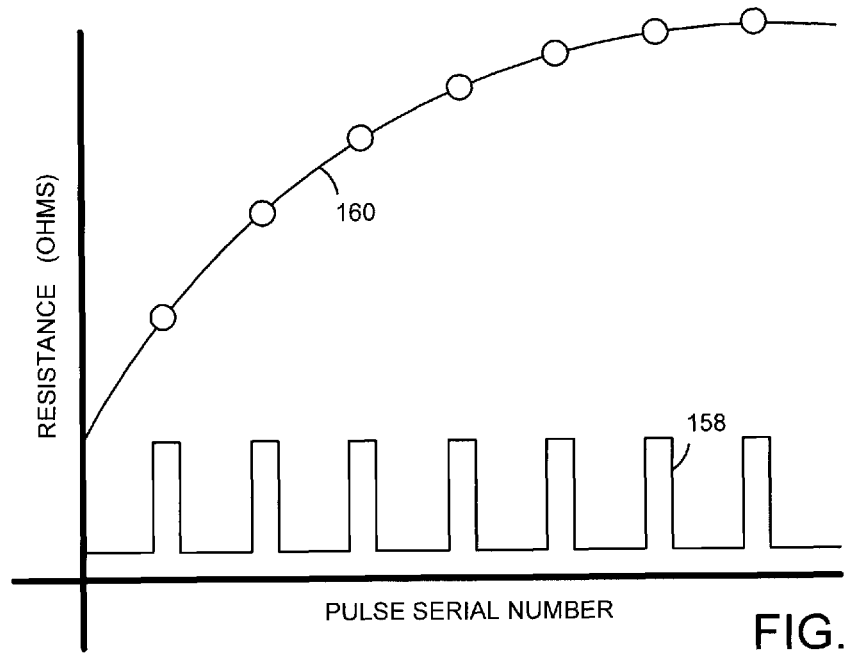
FIG. 6 graphs the operation of a resistive sense element in accordance with various embodiments of the present invention.

The operation of an RSE 136 is graphed in FIG. 6. When a positive electrical pulse 158 is sent to an RSE 136, the resistance depicted as line 160 gradually increases until a high resistance state is eventually met. Thus, an increased number of electrical pulses sent to the RSE 136 correspond to a higher resistance value. However, if an electrical pulse is of sufficient strength and duration, an RSE 136 can be set to the high or low resistance state without incrementally changing resistance values.

Figure 7:
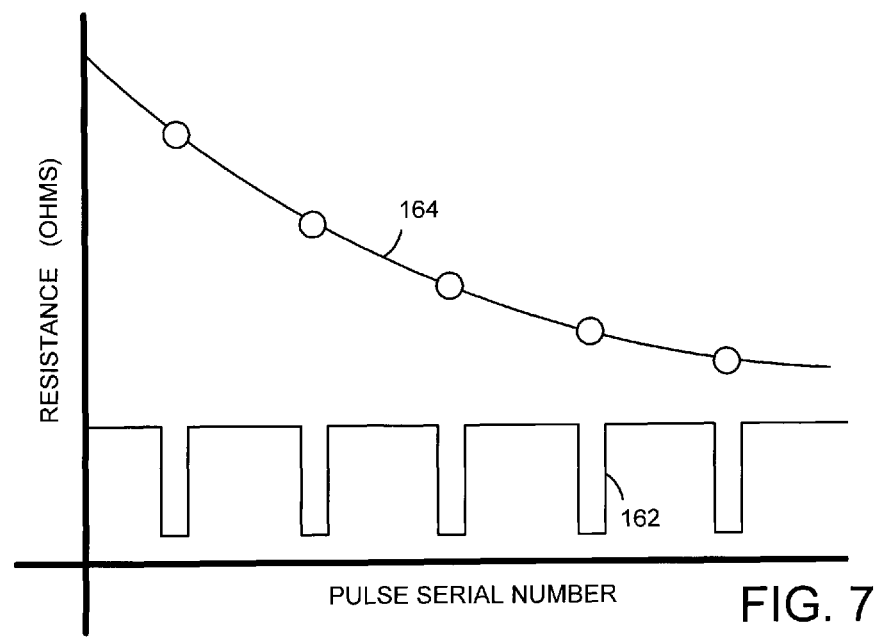
FIG. 7 graphs the operation of a resistive sense element in accordance with various embodiments of the present invention.

FIG. 7 graphs the operation of an RSE 136 when a negative electrical pulse 162 is passed through the RSE 136. Much like the increase in resistance values with a positive pulse 158, a negative electrical pulse 162 causes state change of the media material, either filament formation or oxygen vacancy migration, and decrease the overall resistance of the RSE 136. While the resistance of the RSE 136 can be incrementally decreased, a single electrical pulse can set a high or low resistance state if sufficiently powerful.

Figure 8:
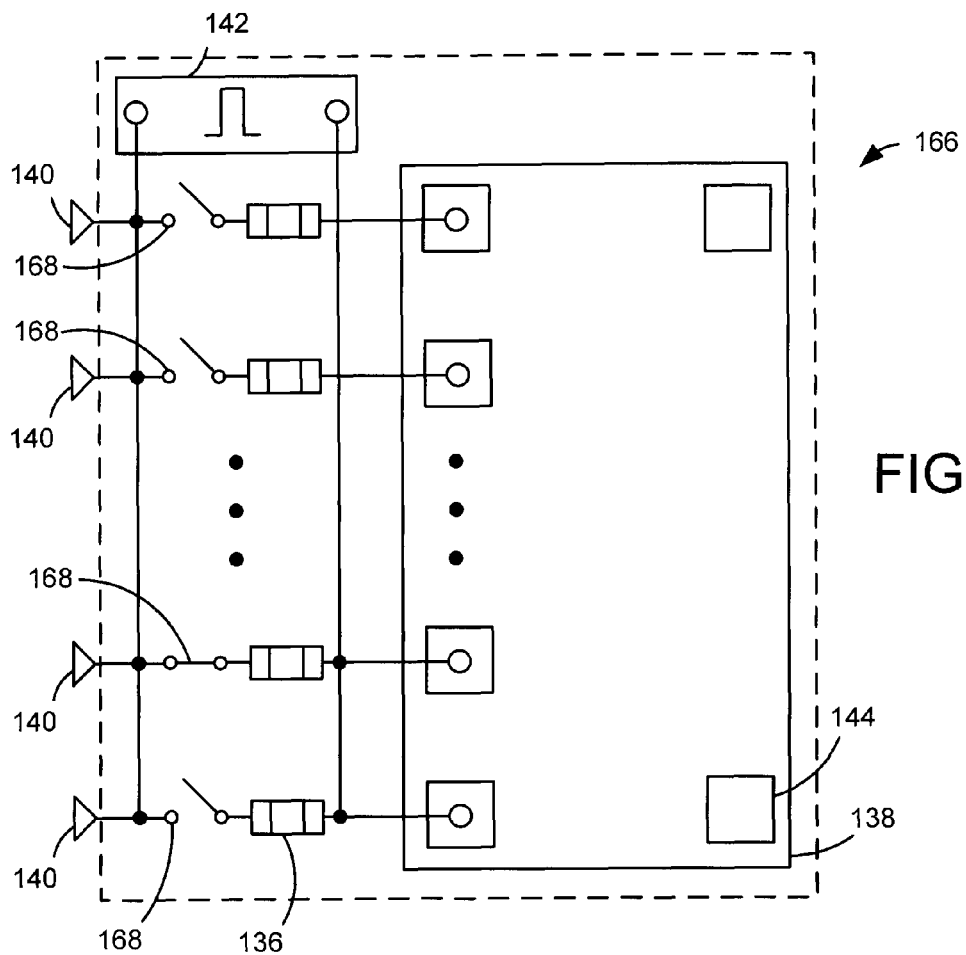
FIG. 8 illustrates a circuit system constructed in accordance with various embodiments of the present invention.

FIG. 8 illustrates an alternative circuit system 166 constructed and operated in accordance with various embodiments of the present invention. When a circuit system has multiple input/output ports 140, which is the most common case, impedance mismatch can occur at more than one port. A programmable RSE 136 is needed for each port 140 to allow for compensation of any impedance mismatch. A single tuning circuit 142 can program an array of RSE 136 through the use of selectable switches 168 for each RSE 136. Therefore, a single RSE 136 can be programmed to a desired resistance by closing the corresponding switch 168 while opening the remaining switches 168 in the array.

Figure 9:
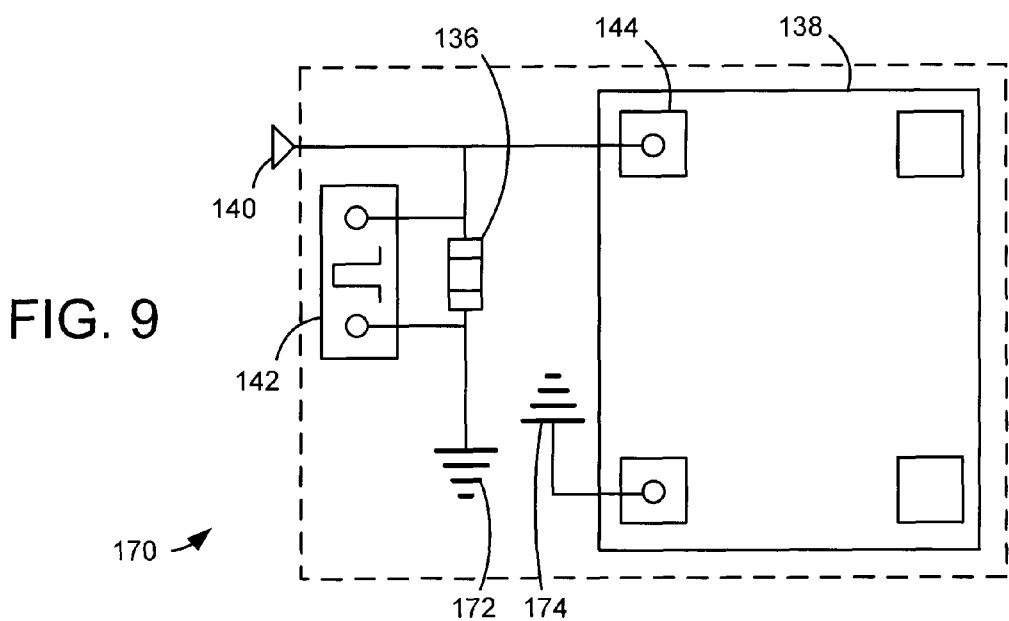
FIG. 9 illustrates a circuit system constructed in accordance with various embodiments of the present invention.

FIG. 9 displays the circuit system 170 alternatively configured and operated in accordance with various embodiments of the present invention. The protection of the input/output port 140 from damage during the manufacturing process is of paramount concern. Often, an electrostatic discharge renders an electrical component useless during manufacturing. To avoid such damage, the RSE 136 and circuit 138 are connected to ground. Further, the RSE 136 can be connected in parallel with the circuit 138 and a first ground 172 while the circuit 138 is attached to a second ground 174.

In operation, the RSE 136 is programmed to a high resistance state when the circuit 138 and port 140 are being operated or in various manufacturing processes, such as testing. The RSE 136 is programmed to a low resistance state when the circuit 138 and port 140 need protection from electrostatic discharge. Any unwanted electrical energy will pass through the low resistance RSE 136 to ground 172 before hitting either the circuit 138 or port 140.

Figure 10:
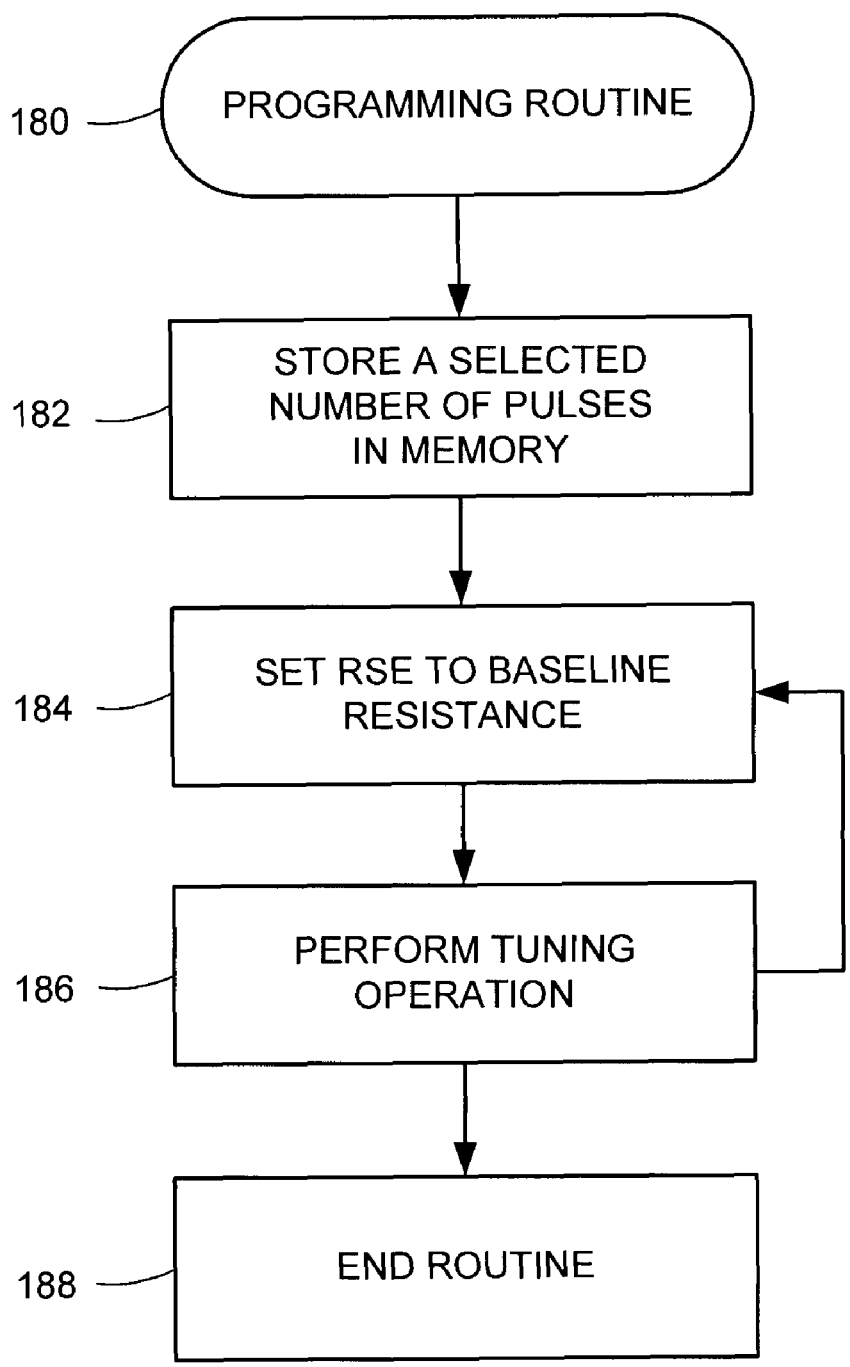
FIG. 10 a flow diagram of a programming routine carried out in accordance with the various embodiments of the present invention.

FIG. 10 provides a flow diagram of a programming routine 180 performed in accordance with various embodiments of the present invention. To program an RSE 136 to a desired resistance, the tuning circuit 142 will store a value in a location in memory that corresponds to a number of electrical pulses needed to program the RSE 136 to a predetermnined resistance at step 182. The RSE 136 is set to a baseline resistance of either a high or low resistance threshold in step 184 by sending a pulse of sufficient size, polarity, and duration to a selected RSE 136 to reach either a high or low resistance threshold.

Next, a tuning operation will be performed at step 186 in which the tuning circuit 142 sends the retrieved number of electrical pulses to the RSE 136 to tune the resistance of the RSE to a predetermnined value. The programming routine can proceed to completion at step 188 or reset the RSE 136 to a baseline resistance at step 184 to be tuned again.

Figure 11:
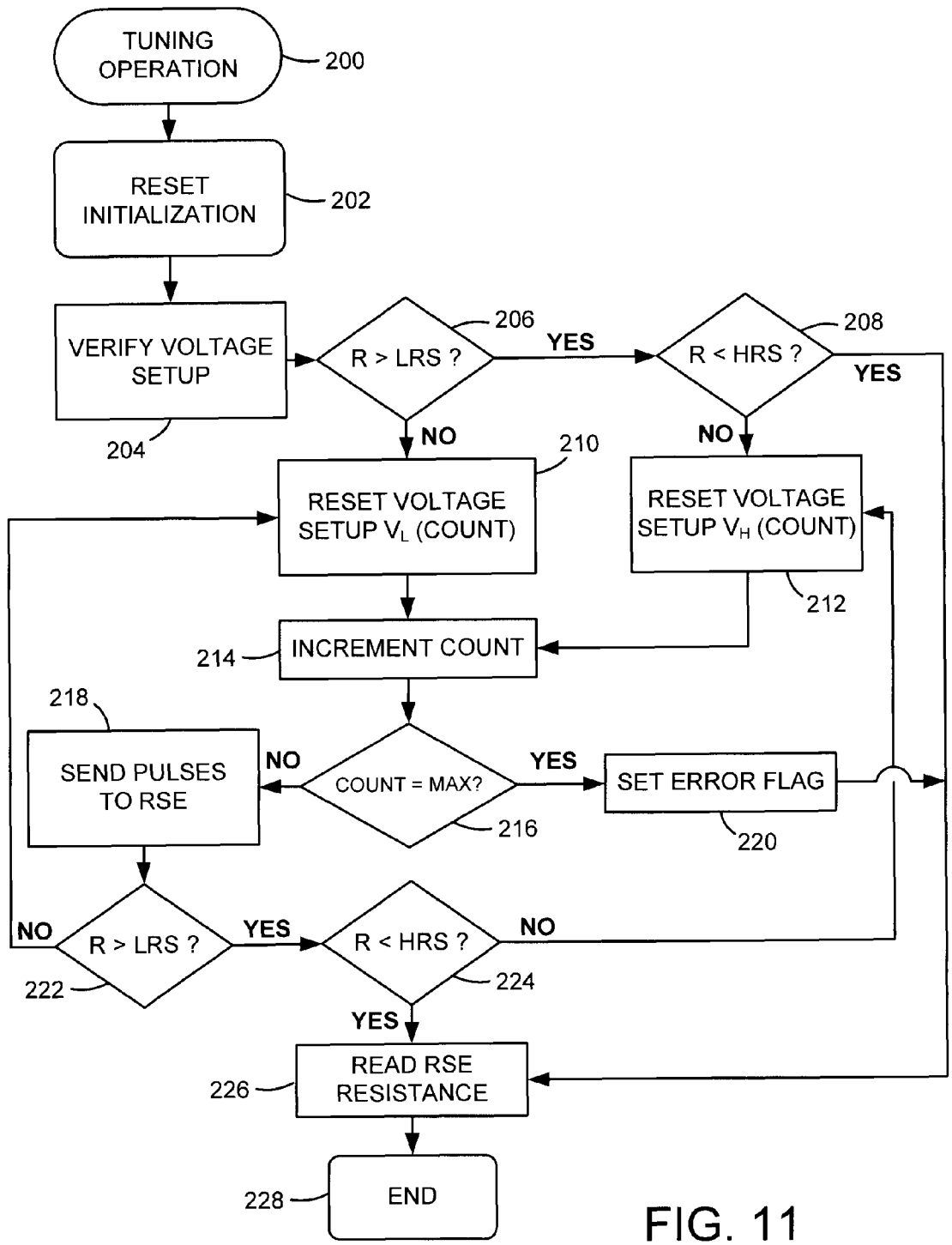
FIG. 11 displays a flowchart of a tuning operation performed in accordance with various embodiments of the present invention.

FIG. 11 shows a flow diagram of an exemplary tuning operation 200 that can be performed individually or as part of step 186 of the programming routine of FIG. 10. In step 202, the tuning is initialized and a counter is set to be zero. The selected RSE 136 is then verified to be a baseline resistance at step 204. A decision is made in step 206 to determine if the resistance of the RSE 136 is greater than the low resistance state threshold. If the resistance is greater, a similar decision is made at step 208 to determine if the resistance is below the high resistance state threshold. However, a resistance that is not at the low or high resistance states will be reset to the baseline resistance at step 210 or 212. That is, if the resistance of the RSE 136 is already at the high or low resistance threshold, a resetting of a baseline resistance is needed.

Next, the tuning count is incremented at step 214. The maximum possible count is checked in step 216 to ensure that a predetermined number of counts has not been exceeded, such as the number of pulses retrieved at step 184. If the number of counts is exceeded, an error flag will be tagged to the operation at step 220. A lower than maximum operation counts allows step 218 to send the selected number of pulses to the RSE 136 to reach a tuned resistance value.

Further, a verification of the tuned resistance is conducted by determining if the resistance of the RSE 136 is above the low resistance state threshold at step 222 and lower than the high resistance state threshold at step 224. If either step 222 or 224 is not satisfactorily passed, the tuning is continued with a voltage pulse level that is determined by the count number. Finally, the resistance of the tuned RSE 136 is read at step 226 before the tuning operation 200 ends at step 228. As can be appreciated, after the resistance of the RSE 136 is programmed, the tuning circuit 142 can be either left connected to the circuit 138 or removed to leave the circuit 138 and port 140 connected as a device. The tuning process can apply to phase change material and PMC as well.

It should be noted that when a ferroelectric material is used to construct the media layer 148 of an RSE 136, a variable capacitance can be used to match the internal circuit impedance. Since the dielectric that determines the capacitance of the device is directly related to the polarization of the ferroelectric, capacitance of the device can be adjusted to match the internal circuit impedance. In the process of tuning a ferroelectric media layer 148, a bipolar voltage level is predetermined and stored in memory with similarly to the number of pulses necessary to achieve a tuned RSE 136 resistance. When variable resistance device replaced by variable capacitance device, the operations and routines of FIGS. 10 and 11 can be used to program the RSE 136 and compensate for impedance mismatch. In addition, the series of tunable RSE 136 in FIG. 8 can be mix of variable resistance devices and variable capacitance devices.

As can be appreciated by one skilled in the art, the various embodiments illustrated herein provide advantages in both electronic device manufacturing efficiency and accuracy. The ability to tune a variable resistance to compensate for deviations from design specifications attributed to manufacturing of complex devices results in greater device yield and cost. Moreover, the reliability of electronic devices is advantageously affected by the ability to ensure electronic components are manufactured within specified tolerances. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising:
    selecting a value in response to a detected impedance mismatch between a port and a circuit, the value indicative of a selected number of consecutive pulses corresponding to a correction resistance;
    setting a resistive sense element (RSE) to a baseline RSE resistance; and
    performing a tuning operation by applying the selected number of consecutive pulses to the RSE to tune the baseline RSE resistance to the correction that compensates for the impedance mismatch.

2. The method of claim 1, wherein a count is incremented for every consecutive pulse.

3. The method of claim 2, wherein an error flag is issued if the count reaches a predetermined number.

4. The method of claim 2, wherein the count resets upon failing to be verified within a predetermined resistance range.

5. The method of claim 1, wherein the final adjusted resistance corresponds with the formation of an electrically conductive filament through the RSE.

6. The method of claim 1, wherein the final adjusted resistance is verified between a predetermined maximum value and a predetermined minimum value.

7. The method of claim 1, wherein the RSE is tested multiple times for compliance with a predetermined resistance minimum value and a predetermined resistance maximum value.

8. The method of claim 1, wherein the selected number of consecutive pulses is applied multiple times to the RSE in order to reach the final adjusted resistance.

9. An apparatus comprising control circuitry configured to detect an impedance mismatch between a circuit and a port, the control circuitry capable of selecting a value indicative of a selected number of consecutive pulses corresponding to a correction resistance, the control circuitry capable of setting a resistive sense element (RSE) to a baseline RSE resistance, and performing a tuning operation by applying the selected number of consecutive pulses to the RSE to tune the baseline RSE resistance to the correction resistance that compensates for the impedance mismatch.

10. The apparatus of claim 9, wherein the baseline RSE resistance a low resistance state.

11. The apparatus of claim 9, wherein the baseline RSE resistance a high resistance state.

12. The apparatus of claim 9, wherein the selected number of pulses is repeatedly retrieved from the memory location during the performance step.

13. The apparatus of claim 9, wherein the pulses induce non-linear incremental changes in said resistance.

14. The apparatus of claim 9, wherein the RSE is used for electro-Static Discharge protection of a port of a circuit.

15. The apparatus of claim 9, wherein the RSE is tested to set a final adjusted resistance.

16. The apparatus of claim 9, wherein the RSE comprises a perovskite complex oxide disposed between a top electrode and a bottom electrode.

17. The apparatus of claim 16, wherein the top electrode and bottom electrode are formed of dissimilar materials.

18. A method comprising:
connecting a circuit to first and second ports respectively with first and second resistive sense elements (RSE), each port having a different impedance;
selecting different first and second values for the first and second RSE in response to a detected impedance mismatch between the first and second ports and the circuit, the first and second values respectively indicative of a selected number of consecutive pulses corresponding to first and second correction resistances;
setting the first and second RSE to a baseline RSE resistance; and
performing a tuning operation by applying the respective selected number of consecutive pulses to the first and second RSE to tune the baseline RSE resistance to the first and second correction resistances that matches the first and second impedances of the respective first and second ports.

19. The method of claim 18, wherein the tuning operation applies a predetermined polarity of positive and negative polarity pulses to modify the electrically conductive filament.

20. The method of claim 18, wherein the final adjusted resistance matches an internal impedance of the circuit.

* * * * *